United States Patent
Elkhatib et al.

(10) Patent No.: US 9,923,003 B2
(45) Date of Patent: Mar. 20, 2018

(54) CMOS IMAGE SENSOR WITH A REDUCED LIKELIHOOD OF AN INDUCED ELECTRIC FIELD IN THE EPITAXIAL LAYER

(71) Applicant: Microsoft Technology Licensing, LLC, Redmond, WA (US)

(72) Inventors: Tamer Elkhatib, San Jose, CA (US); Vei-Han Chan, San Jose, CA (US); William Qian, Los Gatos, CA (US); Onur Can Akkaya, Palo Alto, CA (US); Swati Mehta, San Mateo, CA (US); Cyrus Bamji, Fremont, CA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

(21) Appl. No.: 14/788,224

(22) Filed: Jun. 30, 2015

(65) Prior Publication Data
US 2017/0005124 A1    Jan. 5, 2017

(51) Int. Cl.
*H01L 31/062* (2012.01)
*H01L 27/146* (2006.01)
(Continued)

(52) U.S. Cl.
CPC ........ *H01L 27/14607* (2013.01); *H01L 21/30* (2013.01); *H01L 27/14609* (2013.01);
(Continued)

(58) Field of Classification Search
CPC ......... H01L 27/14607; H01L 27/14649; H01L 27/14685; H01L 27/14689; H01L 27/14643; H01L 27/14627; H01L 27/1464
See application file for complete search history.

(56) References Cited

U.S. PATENT DOCUMENTS

| 6,909,162 B2 | 6/2005 | Wu et al. |
| 7,352,454 B2 | 4/2008 | Bamji et al. |

(Continued)

FOREIGN PATENT DOCUMENTS

| EP | 2881991 A1 | 6/2015 |
| WO | WO2013/123225 A1 | 8/2013 |

OTHER PUBLICATIONS

Milgrew, et al., "Matching the Transconductance Characteristics of CMOS ISFET Arrays by Removing Trapped Charge", In IEEE Transactions on Electron Devices, vol. 55, Issue 4, Apr. 2008, 6 pages.

(Continued)

*Primary Examiner* — Khiem D Nguyen
(74) *Attorney, Agent, or Firm* — Jacob P. Rohwer; Newport IP, LLC

(57) ABSTRACT

A CMOS time-of-flight image sensor must be robust to interface traps and fixed charges which may be present due to fabrication and which may cause an undesired induced electric field in the silicon substrate. This undesired induced electrical field is reduced by introducing a hydrogen-enriched dielectric material. Further remedial techniques can include applying ultraviolet light and/or performing a plasma treatment. Another possible approach adds a passivation doping layer at a top of the detector as a shield against the undesired induced electric field. One or more of the above techniques can be used to prevent any unstable behavior of the time-of-flight sensor.

20 Claims, 7 Drawing Sheets

(51) Int. Cl.
    *H01L 21/30*     (2006.01)
    *G01S 7/481*     (2006.01)

(52) U.S. Cl.
    CPC .. *H01L 27/14632* (2013.01); *H01L 27/14649* (2013.01); *H01L 27/14685* (2013.01); *H01L 27/14687* (2013.01); *H01L 27/14689* (2013.01); *G01S 7/4816* (2013.01)

(56) References Cited

U.S. PATENT DOCUMENTS

| | | | |
|---|---|---|---|
| 7,498,650 B2 | | 3/2009 | Lauxtermann |
| 7,504,681 B2 | * | 3/2009 | Lim .................. H01L 27/14621 257/291 |
| 7,560,674 B2 | * | 7/2009 | Han .................. H01L 27/14601 250/200 |
| 8,314,924 B2 | | 11/2012 | Bamji et al. |
| 8,598,674 B2 | | 12/2013 | Mase et al. |
| 8,953,149 B2 | | 2/2015 | Bamji |
| 2003/0096442 A1 | | 5/2003 | Lee |
| 2006/0061674 A1 | | 3/2006 | Iida et al. |
| 2006/0128087 A1 | | 6/2006 | Bamji et al. |
| 2007/0012863 A1 | * | 1/2007 | Han .................. H01L 27/14601 250/208.1 |
| 2007/0045794 A1 | | 3/2007 | Yaung |
| 2007/0120159 A1 | * | 5/2007 | Lee .................. H01L 27/14689 257/291 |
| 2007/0148806 A1 | * | 6/2007 | Kim .................. H01L 27/14683 438/59 |
| 2008/0283727 A1 | * | 11/2008 | Kitano ................ H01L 27/1462 250/208.1 |
| 2009/0137111 A1 | | 5/2009 | Lee et al. |
| 2010/0148221 A1 | * | 6/2010 | Yu .......................... B82Y 20/00 257/225 |
| 2010/0187501 A1 | * | 7/2010 | Toda ...................... B82Y 20/00 257/21 |
| 2010/0314667 A1 | * | 12/2010 | Nozaki ............. H01L 27/14609 257/225 |
| 2011/0101482 A1 | | 5/2011 | Meynants |
| 2011/0291164 A1 | | 12/2011 | Bamji et al. |
| 2011/0292380 A1 | * | 12/2011 | Bamji .................. G01S 7/4863 356/141.1 |
| 2012/0172648 A1 | | 7/2012 | Seebauer |
| 2013/0113969 A1 | * | 5/2013 | Manabe ............. H01L 27/1461 348/308 |
| 2013/0181312 A1 | | 7/2013 | Hoenk |
| 2013/0193541 A1 | | 8/2013 | Sun et al. |
| 2014/0042506 A1 | | 2/2014 | Ramberg et al. |
| 2014/0264695 A1 | | 9/2014 | Lee et al. |

OTHER PUBLICATIONS

Goiffon, et al., "Analysis of Total Dose-Induced Dark Current in CMOS Image Sensors From Interface State and Trapped Charge Density Measurements", In IEEE Transactions on Nuclear Science, vol. 57 Issue 6, Nov. 9, 2010, 8 pages.

Fomenko, Vasily, et al., "Combined electron-hole dynamics at UV-irradiated ultrathin Si-SiO2 interfaces probed by second harmonic generation," The American Physical Society, 68(8), Aug. 2003, 4 pages.

Yi, Chung, et al., "Improvement of the SiO2/Si interface characteristics by two-step deposition with intermediate plasma treatment using O2/He gas," Journal of Vacuum Science Technologies, B 19(6), Aug. 27, 2001, 6 pages.

International Search Report & The Written Opinion of the International Searching Authority dated Sep. 27, 2016, International Application No. PCT/US2016/037722.

Written Opinion of the International Preliminary Examining Authority dated May 10, 2017, International Application No. PCT/US2016/037722.

"International Preliminary Report on Patentability Issued in PCT Application No. PCT/US2016/037722", dated Aug. 21, 2017, 11 Pages.

* cited by examiner

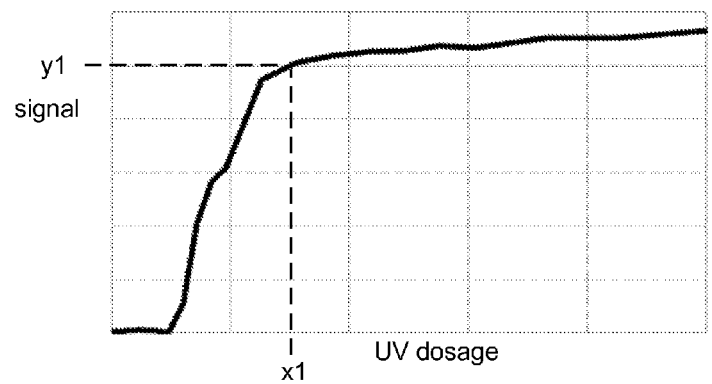
Fig. 5B
Fig. 6
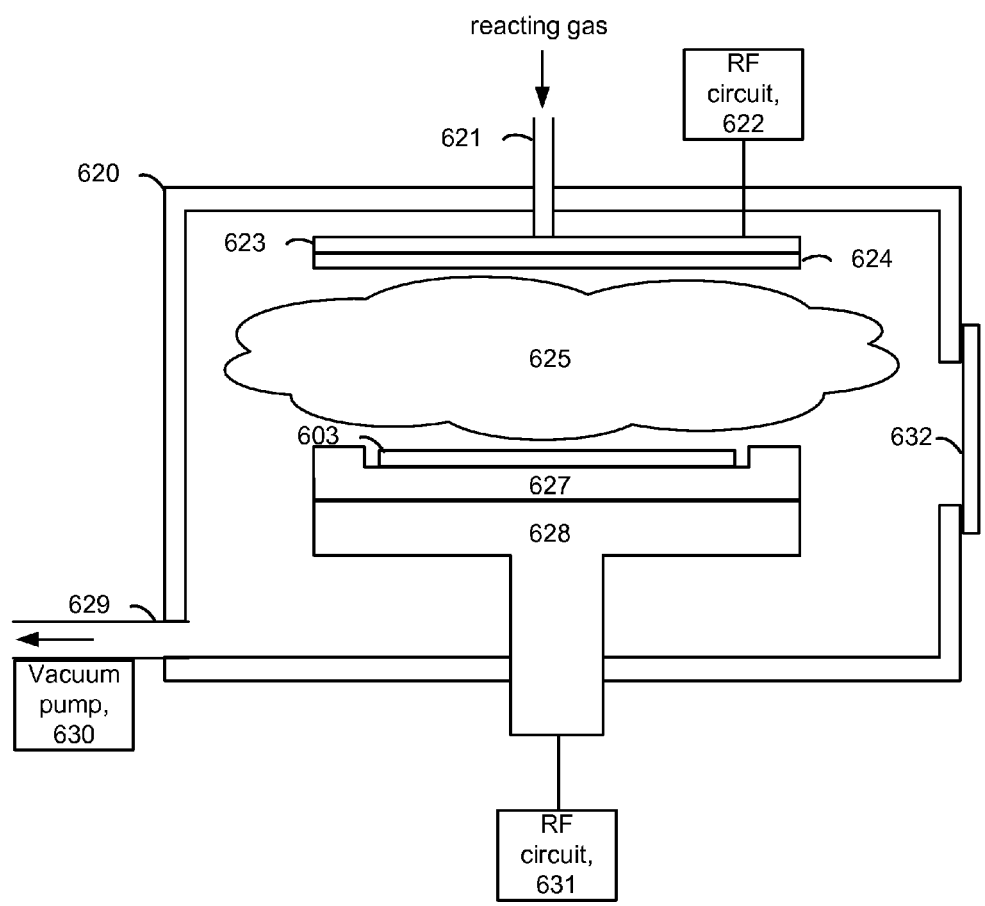

CMOS IMAGE SENSOR WITH A REDUCED LIKELIHOOD OF AN INDUCED ELECTRIC FIELD IN THE EPITAXIAL LAYER

BACKGROUND

CMOS range image sensors such as time-of-flight sensors have become increasingly popular in various applications. CMOS range image sensors typically include a modulated near-infrared light source which illuminates a field of view, and one or more range image sensors, typically operating at the near-infrared wavelength, which sense reflected light from the field of view to form a depth image. A CMOS range image sensor can be provided in a depth camera in a motion capture system, for instance, to obtain data regarding the location and movement of a human body or other subject in a physical space, for input to an application in a computing system. Many applications are possible, such as for military, entertainment, sports and medical purposes. One example application involves detecting hand or other body movements to provide a control input to a gaming console. In some case, the user's bare hand is detected, e.g., in a bare-hand user interface. The CMOS range image sensor should be able to determine the depth information of each pixel in the field of view and to update the distance to every object in the field of view substantially in real time based on a frame rate of the camera.

SUMMARY

One challenge in providing a high performance time-of-flight sensor is that a high number of interface traps and fixed charges can be generated in a standard CMOS fabrication process. These interface traps and fixed charges can reduce the performance of the sensor by causing an undesired induced electric field in the epitaxial layer of the substrate, especially when a very low doped epitaxial layer is used. It is desirable for a CMOS time-of-flight image sensor to be robust to interface traps and fixed charges which may be present due to fabrication.

In one approach, interface traps at an interface between an epitaxial layer of a silicon substrate and an oxide layer on top of the substrate are substantially reduced by modifying the deposition chemistry and charge characteristics of a dielectric material which is deposited on top of the oxide layer. For example, a hydrogen-enriched dielectric material can be added above the oxide layer and the gate electrodes on the top surface of the epitaxial layer. The deposition of this dielectric material in the fabrication process generates hydrogen that passivates and reduces the interface traps. In addition, the dielectric material's inherent charge trapping properties can block fixed charge effects from other layers.

In another approach, an ultraviolet light treatment is performed to further passivate the interface traps and charges. In yet another approach, a plasma treatment is performed. A further possible approach adds a shallow doping region or passivation layer which acts also as a protection electric shield to any induced electric field, e.g., by strongly attenuating or completely canceling the induced electric field due to traps and charges at a top of the epitaxial layer and any additional charges further away in the dielectric material above the epitaxial layer. This added shallow doping region has only a minor effect on the high performance of such a CMOS range image sensor. The shallow doping region can be provided throughout the active area of the epitaxial layer between but not directly under the gate electrodes, in one approach. The shallow doping region can be provided by a controlled ion implantation in the epitaxial layer, for instance.

One or more of the above techniques can be used in combination as well.

In one embodiment, a CMOS image sensor includes a silicon substrate with a top portion comprising a low doped epitaxial layer. An oxide layer such as SiO2 is provided on a top surface of the silicon substrate, wherein an interface is formed between the oxide layer and the top surface of the silicon substrate. Further, at least one pair of biasable gate electrodes, e.g., comprising n-doped polysilicon, are spaced apart on the oxide layer. At least one layer of dielectric material is provided over the biasable polysilicon gate electrodes and the oxide layer. The at least one layer of dielectric material can be a combination stack of two or more dielectric materials (e.g., in respective layers) with at least one hydrogen-enriched dielectric material. The at least one layer of dielectric material is configured to reduce a likelihood of an induced electric field in the epitaxial layer, e.g., where the induced electric field is caused by interface traps at the interface and/or by fixed charges in the at least one layer of dielectric material or other layers of dielectric material. The at least one layer of dielectric material is further configured to prevent an instability behavior of the image sensor, that is, a period in which the image sensor has variable and unreliable performance (e.g., time varying electrical signals for a fixed falling optical intensity and/or fixed phase shift between emitted and reflected light). An additional layer of dielectric material may be provided over the at least one layer of dielectric material along with other components such as a micro lens. The at least one layer of dielectric material may comprise a hydrogen-enriched oxide, e.g., SiO2, or nitride, e.g., Si3N4. The additional layer may comprise, e.g., an oxide or nitride which is not hydrogen-enriched.

This summary is provided to introduce a selection of concepts in a simplified form that are further described below in the description. This summary is not intended to identify key features or essential features of the claimed subject matter, nor is it intended to be used to limit the scope of the claimed subject matter.

BRIEF DESCRIPTION OF THE DRAWINGS

In the drawings, like-numbered elements correspond to one another.

FIG. 5B depicts a plot of the response of a pixel as a function of the UV treatment of FIG. 5A.

FIG. 6 depicts an apparatus for performing a plasma treatment consistent with step 313 of FIG. 3.

DETAILED DESCRIPTION

Figure 1A:
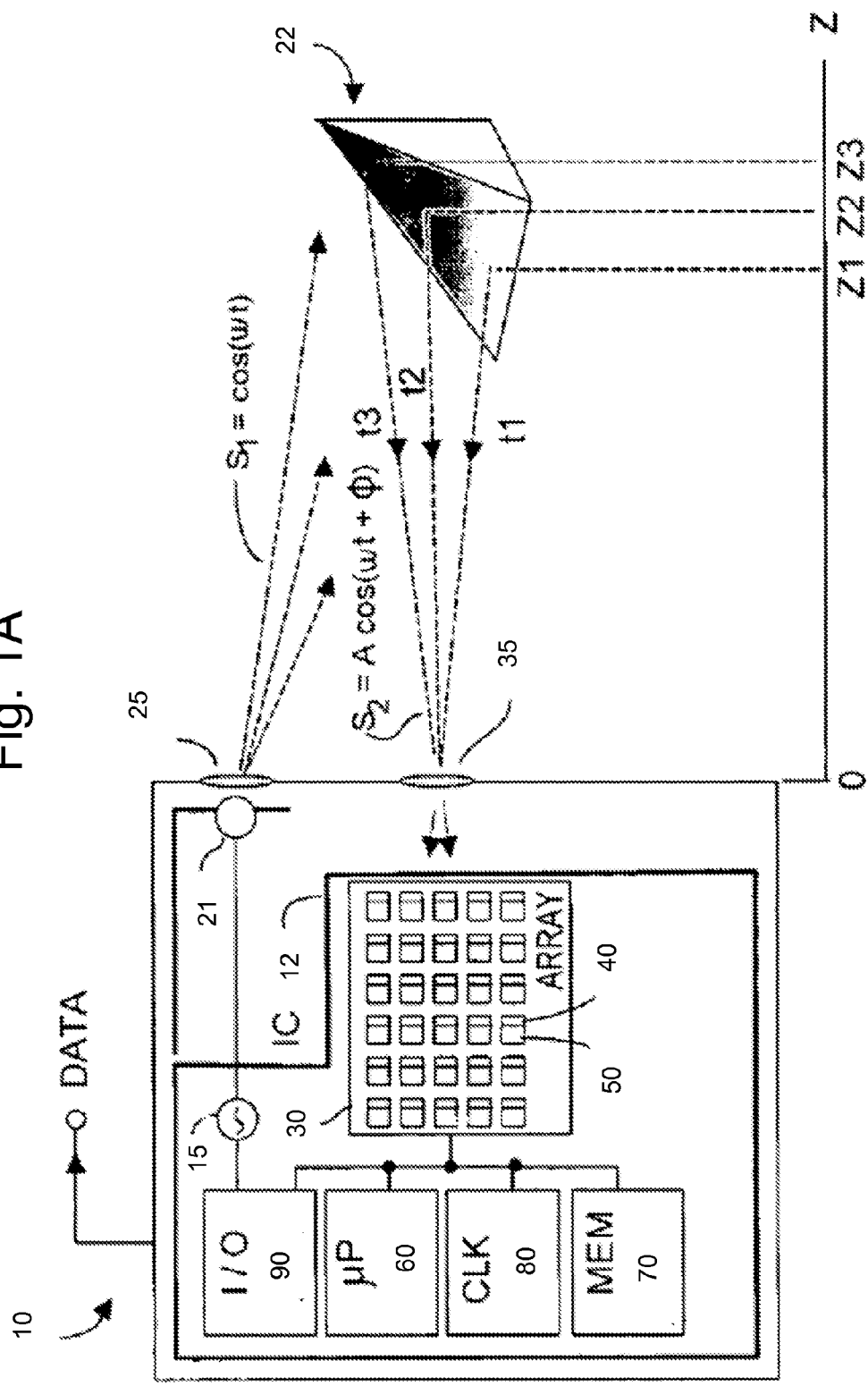
FIG. 1A depicts an example of a depth camera which uses an image sensor such as described herein.

A CMOS time-of-flight image sensor typically includes an interface between a silicon substrate and an oxide layer. However, it has been found that interface traps and fixed charges in the dielectric above the substrate can impair the performance of the image sensor. In particular, it has been found that some range image sensor designs in time-of-flight applications are unstable and exhibit variable and unreliable performance (e.g., time varying electric signals for a fixed falling optical intensity and phase shift). In some cases, this instability behavior appears only in the first few minutes after the sensor is powered on. This problem is caused by varying induced electric fields due to interface traps and charges between the silicon-oxide interface at the wafer surface and other fixed charges above the silicon surface. The trap sensitivity is exacerbated by use of a very low doping concentration in the epitaxial layer of the substrate. As a result, even relatively low amounts of such charges can induce an electric field in the photo detector active area of the image sensor and modify its high performance operation.

After some time has passed with the image sensor operating and powered on, the image sensor may stabilize and achieve good performance. This occurs since the induced photo-charges in the detector area, in additional to modulated space charges, fill the interface traps and isolate its effects. At this time, the image sensor avoids unstable behavior and operates with a steady performance (e.g., same electrical signals for a fixed falling optical intensity and/or fixed phase shift). However, once the image sensor is subsequently powered off, e.g., the sensor chip is unpowered, and powered on again after a period of inactivity, the traps return and unstable operation is again observed. One definition of an unstable time-of-flight sensor is one that exhibits variable and unreliable performance (e.g., time varying electrical signals for a fixed falling optical intensity and/or fixed phase shift). This unstable time-of-flight sensor may behave differently based on different designs. For some designs, the unstable behavior remains indefinitely. For other designs, the unstable behavior appears in the first few seconds or minutes (e.g., up to 30-120 seconds or up to 5-10 minutes) after the sensor is powered on. Then, after this initial unstable period, it starts to operate steadily with reliable performance (e.g., same electrical signals for a fixed falling optical intensity and/or fixed phase shift) for as long as it is powered on. Subsequently, this behavior of initial unstable performance for few seconds or minutes is repeated once the sensor is subsequently powered off and on again.

One approach to resolve the undesired effects of interface traps is to perform a hydrogen annealing step (e.g., thermal annealing in a hydrogen ambient) to passivate the interface traps. This hydrogen annealing step is typically a final annealing step in the CMOS process which occurs after the fabrication of the oxide layers, gate electrodes, metal layers and top wafer dielectric passivation layer. This results in hydrogen atoms diffusing through the metal vias and/or contacts, then bonding to the silicon atoms at the interface in place of the traps. However, even a relatively long hydrogen annealing step may not be sufficient to remove the undesired effects of the interface traps. It is believed that hydrogen diffuses through the metal vias all the way to the oxide/silicon interface. However, the typical design of an image sensor pixel contains a limited number of transistors to increase the pixel fill factor and these transistors are located spaced apart from the photodetector area in the pixel. Hence, regular hydrogen annealing may not be sufficient and effective in such cases. On the other hand, hydrogen annealing may be effective if the design of the image sensor is modified to include many extra vias near the photodetector area and near the undesired interface traps areas.

A CMOS time-of-flight image sensor device and various fabrication techniques for it are provided herein which address the above issues to achieve a robust operation without any significant change in detector performance or power consumption. One example technique involves modifying the dielectric film above the silicon surface so that it has a desirable chemistry and charge characteristics which minimize the effects of standard wafer interface traps. For example, a hydrogen-enriched oxide or nitride can be used in specific areas of the sensor such that the deposition of this additional dielectric material generates hydrogen that diffuses to the interface traps and passivates them. In addition, the material possesses a charge-trapping capability and can be exploited by subsequent treatments to resist fixed charge effects from other layers. Another example technique involves using an ultraviolet (UV) treatment to compensate for traps and charges. Another example technique involves using a plasma treatment such as an oxygen (02) plasma treatment to compensate for traps and charges. Another example technique involves adding a passivation doping layer as an electric field shield for traps and charges at the top of the detector. These various fabrication techniques can be used alone or in combination. Further, the techniques are compatible with Complementary Metal-Oxide semiconductor (CMOS) fabrication processes. CMOS is a technology for constructing integrated circuits. A CMOS image sensor can therefore be implemented using CMOS circuits including metal oxide semiconductor field effect transistors (MOSFETs) for logic functions.

FIG. 1A depicts an example of a depth camera 10 which uses an image sensor such as described herein. The depth camera is configured as a ToF system and can be implemented on a single integrated circuit (IC) 12, without moving parts and with relatively few off-chip components. The depth camera includes a two-dimensional array 30 of pixel detectors 40, each of which has dedicated circuitry 50 for processing detection charge output by the associated detector. In a typical application, the array might include 100×100 pixels, and thus include 100×100 processing circuits. The IC also includes a microprocessor or microcontroller unit 60, a memory 70 (e.g., random access memory and read-only memory), a high speed distributable clock 80, and various computing and input/output (I/O) circuitry 90. Among other functions, microcontroller unit 60 may perform distance to object and object velocity calculations.

Under control of the microprocessor, a source of optical energy (emitter 21) is periodically energized and emits optical energy via lens 25 toward a target object 22. Typically the optical energy is light, for example emitted by a laser diode or LED device. Some of the emitted optical energy will be reflected off the surface of target object, and will pass through an aperture field stop and lens, collectively 35, and will fall upon a two-dimensional array 30 of photo detectors 40 where an image is formed. Each imaging pixel detector measures both intensity or amplitude of the optical energy received, and the phase-shift of the optical energy as it travels from emitter 21, through distance Z to the target object, and then distance again back to the imaging sensor array. For each pulse of optical energy transmitted by the emitter, a three-dimensional image of the visible portion of target object is acquired.

Emitted optical energy traversing to more distant surface regions of target object before being reflected back toward the depth camera will define a longer time-of-flight than radiation falling upon and being reflected from a nearer surface portion of the target object (or a closer target object). For example the time-of-flight for optical energy to traverse the roundtrip path noted at t1 is given by $t1=2 \cdot Z1/C$, where C is velocity of light. A TOF sensor system can acquire three-dimensional images of a target object in real time. Such systems advantageously can simultaneously acquire both luminosity data (e.g., signal amplitude) and true TOF distance measurements of a target object or scene.

In one embodiment of the depth camera, each pixel detector has an associated high speed counter that accumulates clock pulses in a number directly proportional to TOF for a system-emitted pulse to reflect from an object point and be detected by a pixel detector focused upon that point. The TOF data provides a direct digital measure of distance from the particular pixel to a point on the object reflecting the emitted pulse of optical energy. In another embodiment, in lieu of high speed clock circuits, each pixel detector is provided with a charge accumulator and an electronic shutter. The shutters are opened when a pulse of optical energy is emitted, and closed thereafter such that each pixel detector accumulates charge as a function of return photon energy falling upon the associated pixel detector. The amount of accumulated charge provides a direct measure of round-trip TOF. In either embodiment, TOF data permits reconstruction of the three-dimensional topography of the light-reflecting surface of the object being imaged.

An oscillator 15 is controllable by the microprocessor to emit high frequency (perhaps 200 MHz) component periodic signals, ideally representable as $A \cdot \cos(\omega t)$. The emitter 21 transmits optical energy having a low average and peak power in the tens of mW range. Such emitted signals allow use of inexpensive light sources and simpler, narrower bandwidth (e.g., a few hundred KHz) pixel detectors 40.

In this system, there will be a phase shift $\varphi$ due to the time-of-flight (ToF) required for energy transmitted by the emitter ($S1=\cos(\omega t)$) to traverse distance z to a target object 22, and the return energy detected by a photo detector 40 in the array 30, $S2=A \cdot \cos(\omega t+\varphi)$, where A represents brightness of the detected reflected signal and may be measured separately using the same return signal that is received by the pixel detector.

Figure 1B:
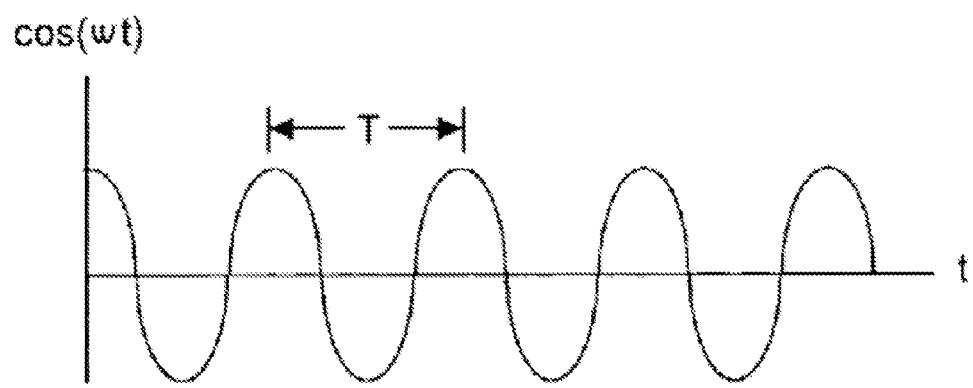
FIG. 1B depicts the high frequency component of an exemplary idealized periodic optical energy signal in the depth camera of FIG. 1A.
Figure 1C:
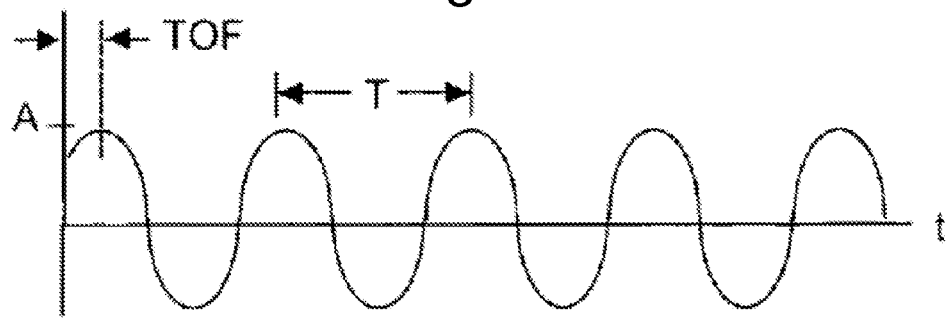
FIG. 1C depicts the returned version of the transmitted waveform in the depth camera of FIG. 1A.

FIGS. 1B and 1C depict the relationship between phase shift $\varphi$ and time-of-flight, again assuming for ease of description a sinusoidal waveform. In an alternative approach, a square wave is used. The period for the waveforms is $T=2\pi/\omega$. The phase shift $\varphi$ due to time-of-flight is: $\varphi=2 \cdot \omega \cdot z/C=2 \cdot (2\pi f) \cdot z/C$, where C is the speed of light (300,000 Km/sec). Thus, a distance z from the energy emitter (and from the detector array) to the target object is given by: $z=\varphi \cdot C/2\omega=\varphi \cdot C/\{2 \cdot (2\pi f)\}$.

FIG. 1B depicts the high frequency component of an exemplary idealized periodic optical energy signal, here a signal represented as $\cos(\omega t)$. The period T of the waveform shown is $T=2\pi/\omega$. The signal is depicted as though it were AC-coupled in that any magnitude offset is not present. The operative frequency of the transmitted signal may be in the few hundred MHz range, and the average and the peak transmitted power may be relatively modest, e.g., less than about 50 mW or so. A portion of the transmitted energy reaches a target object and is at least partially reflected back toward the depth camera to be detected.

FIG. 1C depicts the returned version of the transmitted waveform, denoted $A \cdot \cos(\omega t+\varphi)$, where A is an attenuation coefficient, and $\varphi$ is a phase shift resulting from the time-of-flight (TOF) of the energy in traversing the distance to the target object. Knowledge of the time of flight provides the distance z from a point on the target object to the recipient pixel detector in the array of detectors.

Another example of a depth sensing camera system can include a structured light depth camera, with a near infrared projected pattern and a general CMOS image sensor configured to operate at these wavelengths.

The sensor converts the incident light to an electrical current which can be measured to detect a distance to the object.

One simplified definition of modulation contrast is (Sin−Sout)/(Sin+Sout), where Sin is the detected light signal from the sensor when the reflected modulated light is in phase with a reference modulated signal and Sout is the detected light signal from the sensor when the reflected modulated light is out of phase with a reference modulated signal. A variance in the depth measurement is lower when the modulation contrast is higher. Optical sensitivity generally refers to an amount of increase in the electrical current based on an amount of increase in the incident light. Quantum Efficiency can measure the sensor optical sensitivity and it is defined as the ratio of the number of charge carriers collected by the sensor to the number of photons of a given energy illuminating the sensor.

A higher modulation contrast at higher frequencies and a better optical sensitivity result in a better extracted depth quality, a larger depth operation range and a lower power consumption. Techniques provided herein improve modulation contrast and optical sensitivity without any significant increase in cost or complexity.

Typically a CMOS image sensor is fabricated in a substrate in which the upper portion of the substrate is an epitaxial layer with relatively low doping. The epitaxial layer is generally the photosensitive semiconductor layer of the sensor. The incident light radiation that is not absorbed in this epitaxial layer is considered as lost optical energy. The length of this epitaxial layer can be, e.g., a few microns (1-10 um) while the optical absorption depth at long wavelengths (red, near infrared, and infrared) can be as few as tens of microns. Hence, most of the standard CMOS image sensors suffer from lower optical sensitivity (quantum efficiency) at these long wavelengths. The techniques provided herein address the above and other issues.

In an example implementation, the operation principle of a phase modulation time-of-flight technique is as follows. The signal amplitude transmitted by the optical source can be represented by sine wave or square wave with a specific modulation frequency. This optical signal travels the distance to the object, is reflected, and subsequently detected by the time-of-flight sensor. A phase shift results between the transmitted signal and the detected signal due to the time of flight. The amplitude of the received signal is a function of several factors, such as input light power and reflectivity of the object; however, the phase shift depends only on the distance of the photodetector to the object and the refractive index of the medium where the imaging takes place.

In one implementation of a phase demodulation based time-of-flight image sensor, the clocks driving the gate electrodes in the photodetector and the optical source are modulated in synchrony. The received signal is mixed with a phase-delayed form of the signal driving the optical source. This mixing is achieved by differentially modulating the quantum efficiency (QE) of the detectors in the pixel. The quantum-efficiency-modulation (QEM)-based detection can be performed at different input signal phases, such as 0, 90, 180 or 270 degrees. This multiphase measurement enables calculation of a unique phase angle for each distance independent of the received signal amplitude. In theory, two phases are sufficient for this calculation; however, using more than two phases can cancel offsets, and reduce harmonics in the measurements, thereby resulting in much better depth data.

Several embodiments of QE modulation are possible. There are two general categories. One category involves variable phase delay approaches in which dedicated electronic mixers (e.g., Gilbert cells) are replaced by QE modulation. A second category involves mixing with fixed phase delays using QE modulation, and implements a variety of spatial and temporal multiplexing approaches. Advantageously, both methods can modulate QE of MOS-implemented photodiodes by changing photodiode reverse bias, or by providing MOS-implemented photodiodes with a photogate, and then changing the gate voltage. Single-ended or double-ended differential signal processing may be employed with both methods. Differential QE modulation advantageously allows faster QE modulation, and provides a differential output that substantially removes common mode effects due to ambient light and photodiode dark current. In general, both categories advantageously accumulate photodetector signal charge on a photodiode capacitor. If desired, accumulated charge may be examined periodically when QE modulation is stopped. Such signal accumulation approaches are preferred over methods that seek to directly measure a high frequency small magnitude photocurrent.

Figure 1D:
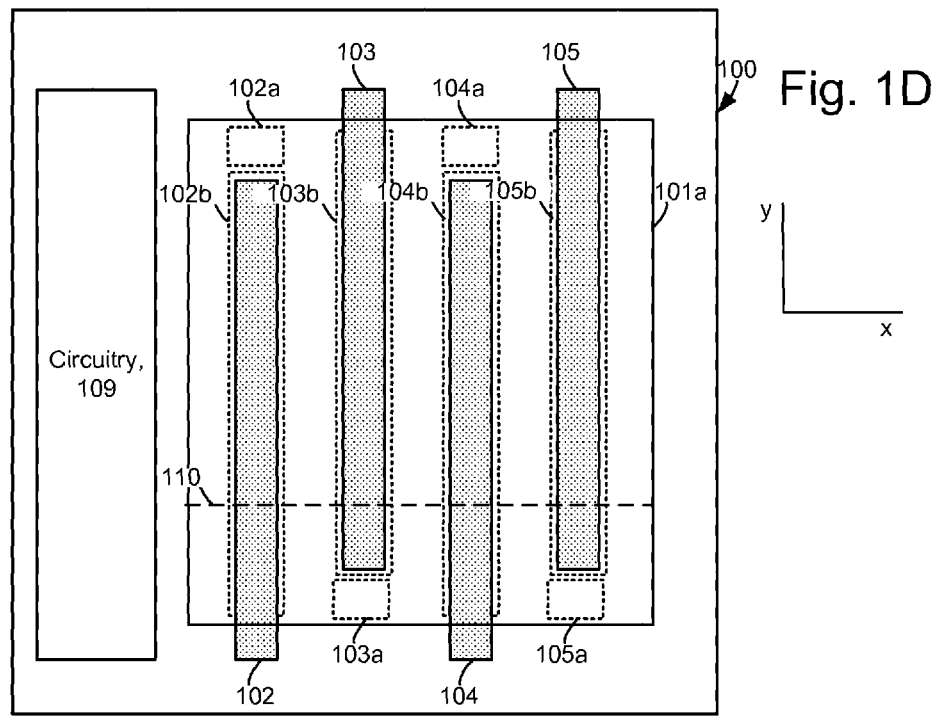
FIG. 1D depicts a top view of a pixel in an image sensor, where the pixel includes four elongated gate electrodes.

FIG. 1D depicts a top view of a pixel in an image sensor, where the pixel includes four elongated gate electrodes. This example uses a photogate as a photo generated carrier collector node. Other types of collector nodes may be used as an alternative.

A pixel in a time-of-flight image sensor typically includes two, four or six gate electrodes which collect charges which are generated in the substrate due to incoming light. The gate electrodes thus generally are provided as at least one pair of biasable gate electrodes. Charges are accumulated by the gate electrodes and read out from each pixel to determine an amount of light which was detected by the pixel. In the case of four gate electrodes, each frame of data includes a period in which charge is acquired, followed by a read out period and a data processing period. This is an example of a multi-gate phase demodulation pixel in a time-of-flight sensor. However, the techniques provides herein are suitable for use with many different designs of demodulation pixels that work as time-of-flight pixels.

Here, an example pixel 100 includes an active light-detection region 101a (the photo detector active area of the image sensor/pixel) in which charges are generated in a substrate 120 (FIG. 1E) when light is received. The light-detection region may include an oxide layer 101 which is deposited over the active light-detection region. Further, elongated gate electrodes 102, 103, 104 and 105 are provided directly above respective p-type doped regions 102b, 103b, 104b and 105b, respectively, of a substrate. The charges collected by each gate electrode are routed to one of the n+doped charge collection regions 102a, 103a, 104a and 105a from which the charges are read out. Circuitry 109 is also provided in each pixel for performing logic functions based on the read out charges of the pixel and reporting back to a sensor controller. The circuitry can provide timing or clock signals to the gate electrodes to read out charges at specified times. The pixel extends in an x-y plane of a Cartesian coordinate system, where the x-direction is a first direction and the y-direction is a second direction which is perpendicular to the first direction.

Figure 1E:
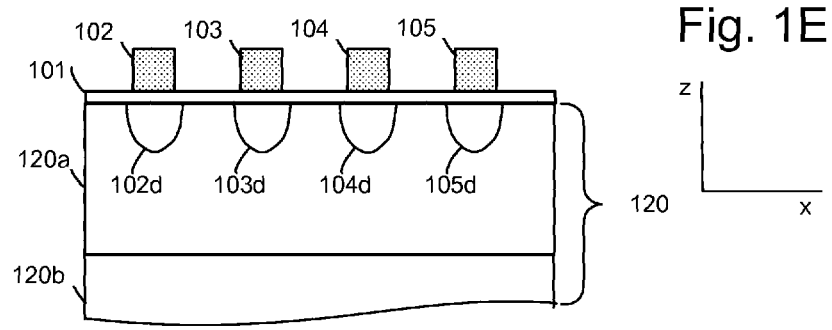
FIG. 1E depicts a cross-sectional view along line 110 of the pixel of FIG. 1D.

FIG. 1E depicts a cross-sectional view along line 110 of the pixel of FIG. 1D. The gate electrodes 102, 103, 104 and 105 are depicted above the oxide layer 101. A low p-type doping area 102d, 103d, 104d and 105d can be provide under each gate electrode either with a similar width or little bit wider width than the gate electrodes 102, 103, 104 and 105, respectively. In this example, at least part of the low p-type doping area is directly under each gate electrode. In one approach, the p-type region is provided by ion implantation. This could be done before or after the desposition of the gate electrodes, for instance. The electrodes 102 and 103 may be first and second gate electrodes, respectively, which are charge collectors in a multi-gate phase demodulation pixel in a time-of-flight sensor.

Figure 1F:
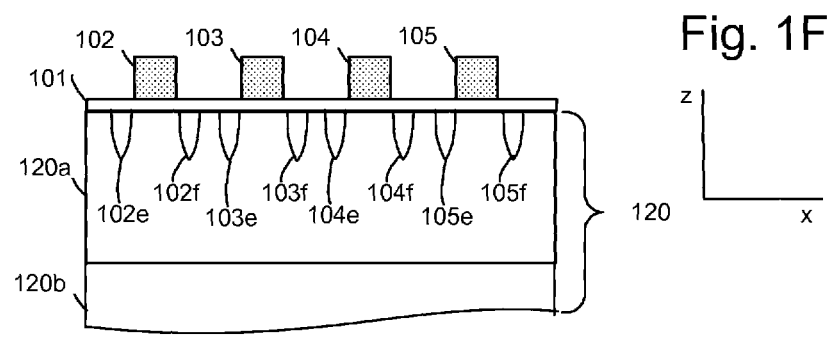
FIG. 1F depicts another example cross-sectional view along line 110 of the pixel of FIG. 1D.

In another example, shown in FIG. 1F, the doping areas are adjacent to rather than directly under the gate electrodes. FIG. 1F depicts another example cross-sectional view along line 110 of the pixel of FIG. 1D. The gate electrodes 102, 103, 104 and 105 have p-type doping areas 102e and 102f, 103e and 103f, 104e and 104f, and 105e and 105f, respectively, on opposing sides of the gate electrode.

Figure 2A:
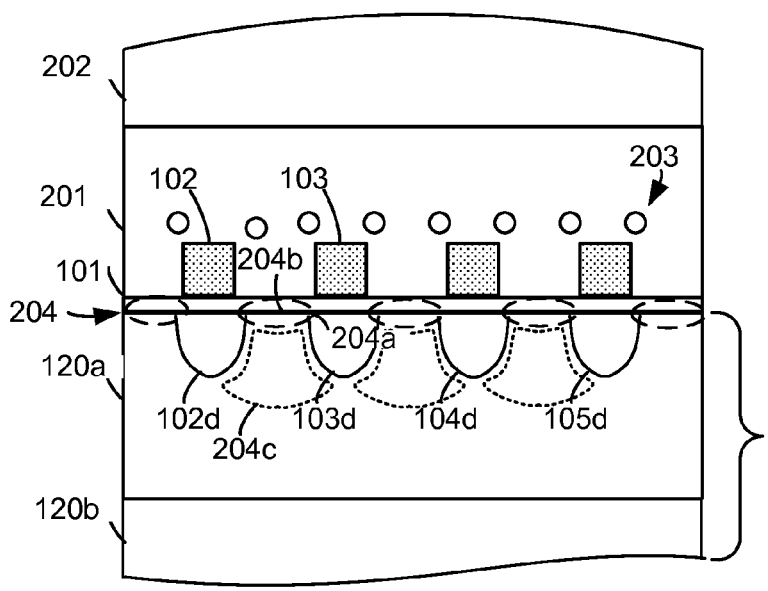
FIG. 2A depicts a cross-sectional view along line 110 of the pixel of FIG. 1D, after a dielectric material 201 and a micro lens 202 are provided, showing interface regions and fixed charges in a comparative example.

FIG. 2A depicts a cross-sectional view along line 110 of the pixel of FIG. 1D, after a dielectric material 201 and a micro lens 202 are provided, showing interface regions and fixed charges in a comparative example. The substrate 120 includes an underlying non-epitaxial layer 120b and an epitaxial layer 120a. In one approach, the underlying portion is on the order of several hundred μm thick. An example thickness of the epitaxial layer is about 3 to 10 μm.

An interface 204 exists between the oxide layer 101 and the epitaxial layer 120a. The interface 204 includes interface portions which are between the gate electrodes. For example, an interface portion 204a is between the gate electrodes 102 and 103. A region 204c is an example region in which an induced electric field may occur in the absence of remedial techniques as described herein.

The induced electric field is caused by an interaction between the interface traps and the epitaxial layer, and is different than, and interferes with, the electric field which is caused by the application of a voltage to the gate electrodes.

Figure 2B:
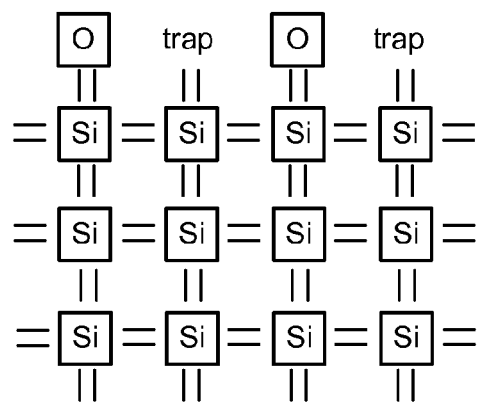
FIG. 2B schematically depicts interface traps in a pixel.

The interface portions are locations in the epitaxial layer in which interface traps, also referred to as charge traps, may be present. The silicon atom has four valence electrons and therefore requires four bonds to fully saturate the valence shell. In the crystalline structure of the epitaxial layer, each silicon atom establishes bonds to its four neighboring atoms, if possible. However, for the silicon atoms at the surface 204b of the epitaxial layer, fewer than four neighboring silicon atoms are present. Traps are formed at locations in which the neighboring silicon atoms are missing, as indicated in FIG. 2B. When the oxide layer is deposited on the epitaxial layer, some of the traps are replaced by oxygen atoms which bond to the silicon atoms. However, some traps remain. Fixed charges 203 can also be present, e.g., in the dielectric material 201 at locations of point defects. The fixed charges can be in the gate oxide or in the dielectric material, further away from the substrate. These fixed charges can also change the function of the sensor even if they are relatively far away from the epitaxial layer.

FIG. 2B schematically depicts interface traps in a pixel. Each silicon atom in the epitaxial layer of the substrate is denoted by "Si" and a bond to another atom or charge is represented by double parallel lines. An oxygen atom is denoted by "O." A charge trap is denoted by "trap."

Figure 2C:
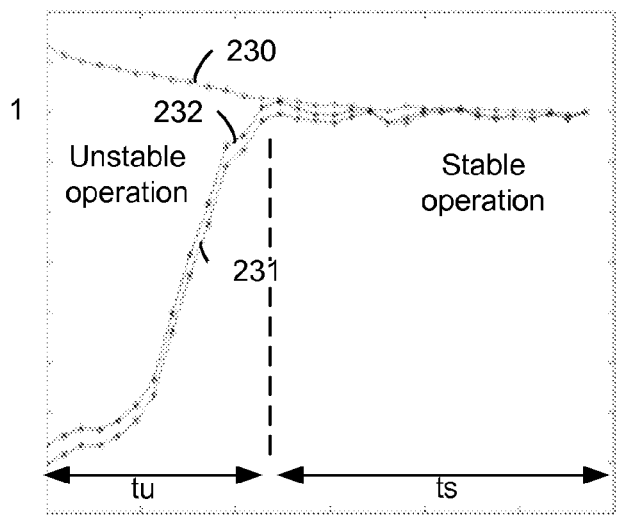
FIG. 2C depicts a plot of the performance of an image sensor versus time, showing a period to of unstable operation followed by a period is stable operation.

FIG. 2C depicts a plot of the performance of an image sensor versus time, showing a period to of unstable operation followed by a period is stable operation. A plot 230 depicts the modulated carrier intensity, which is the intensity of the light received at the sensor. A plot 231 depicts the modulation contrast, and a plot 232 is the product of the two other plots. The vertical axis is in arbitrary units normalized to one. In the unstable period, the modulation contrast is low and gradually increases until it stabilizes. The horizontal axis may extend over about ten minutes, for example. The unstable period may be, e.g., up to 30-120 seconds or up to 5-10 minutes, for example.

Figure 3:
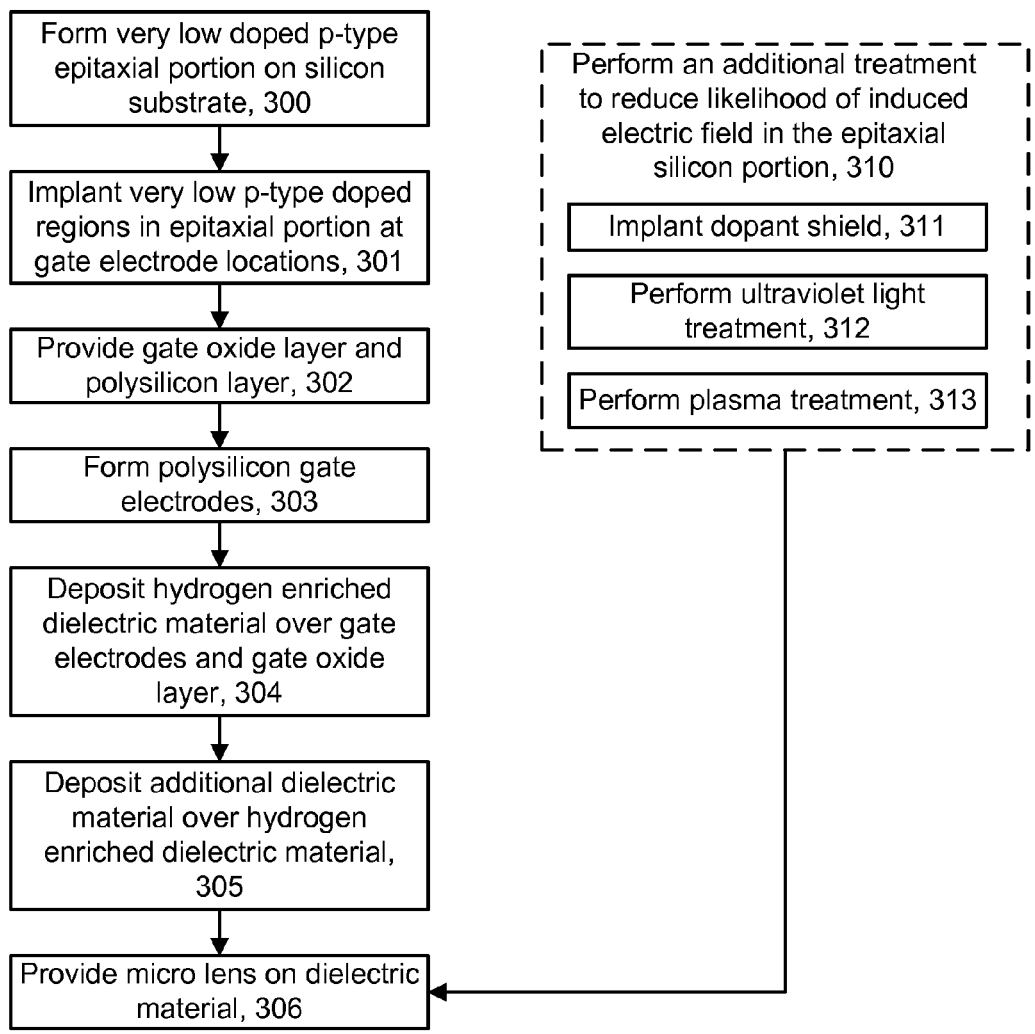
FIG. 3 depicts a method for fabricating an image sensor in which a likelihood of an induced electric field due to interface traps and fixed charges is reduced.

FIG. 3 depicts a method for fabricating an image sensor in which a likelihood of an induced electric field due to interface traps and fixed charges is reduced. Step 300 includes forming a very low doped p-type epitaxial layer on a silicon substrate, such as depicted in FIG. 1E. For example, the underling silicon substrate can be heavily doped p-type, with a dopant concentration of about $1\text{-}5*10^{18}/cm3$ or higher. The doping concentration for the epitaxial layer can be less than $5\times10^{14}/cm3$, for instance, which is lower than that of the underlying silicon substrate. Step 301 includes implanting very low p-type doped regions in the epitaxial layer at gate electrode locations. These p-type doped regions will be directly under the gate electrodes when they are subsequently formed. For example, the doping concentration can be between $10^{16}$ and $5\times10^{17}/cm3$. An example dopant is Boron. These p-type doped regions are barrier regions that minimize charge collection when a zero or low positive voltage is applied to a gate electrode.

Step 302 includes providing a gate oxide layer, e.g., SiO2, with an example thickness of 50 Angstroms, and a thicker polysilicon layer which may be doped n type or p type. For example, the SiO2 may be deposited using CVD or grown on the epitaxial layer by exposing the epitaxial layer to oxygen.

Step 303 includes forming polysilicon gate electrodes by patterning the polysilicon layer, such as depicted in FIG. 1E. Step 304 includes depositing a hydrogen-enriched dielectric material over the gate electrodes and the gate oxide layer. For example, the hydrogen-enriched dielectric material be an oxide (e.g., SiO2) or a nitride (e.g., SiN). In SiO2, the hydrogen can be added in Si—H bonds or O2-H bonds or as entrapped free hydrogen. Similarly, in SiN, the hydrogen can be added in Si—H bonds or N—H bonds or as entrapped free hydrogen.

In one approach, the hydrogen-enriched layer can be grown in a gaseous phase where the hydrogen content is adjusted by controlling the film forming conditions in a plasma-enhanced chemical vapor deposition (PECVD) process. For example, these conditions include parameters associated with the design of the system, the inductive coil, and the plasma source, in addition to process parameters such as substrate temperature, reactant gases and their ratio, RF biasing power, and deposition pressure. Generally, these conditions can be adjusted to obtain a desired amount of hydrogen enrichment, e.g., as expressed as a percentage in atomic weight. An example range of hydrogen enrichment is 1 to 5% in atomic weight.

Step 305 includes depositing an additional dielectric material over the hydrogen-enriched dielectric material. The additional dielectric material, which acts as a passivation layer, could also be an oxide (e.g., SiO2) or a nitride, but is thicker than the gate oxide layer and typically thicker than the hydrogen-enriched dielectric material. The gate oxide and the additional dielectric material are typically undoped. Step 306 includes providing a micro lens on the dielectric material, as depicted in FIG. 2A.

Figure 4A:
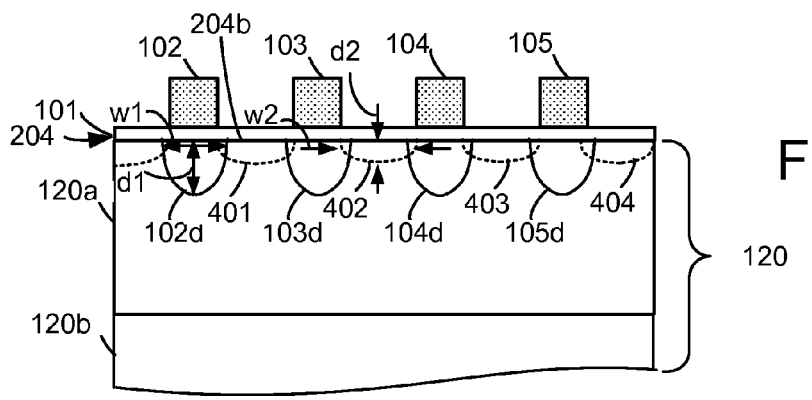
FIG. 4A depicts a cross-sectional view along line 110 of the pixel of FIG. 1D, consistent with steps 300-303 and 311 of FIG. 3.

Step 310 includes performing one or more additional treatments to reduce the likelihood of an induced electric field in the epitaxial layer, e.g., due to interface traps and fixed charges above the substrate. In one option, step 311 involves implanting an electric field shield in the epitaxial layer of the substrate. This can be a shallow p-type region such as depicted in FIG. 4A with a doping concentration of about $10^{16}$ to $10^{18}/cm3$.

Figure 5A:
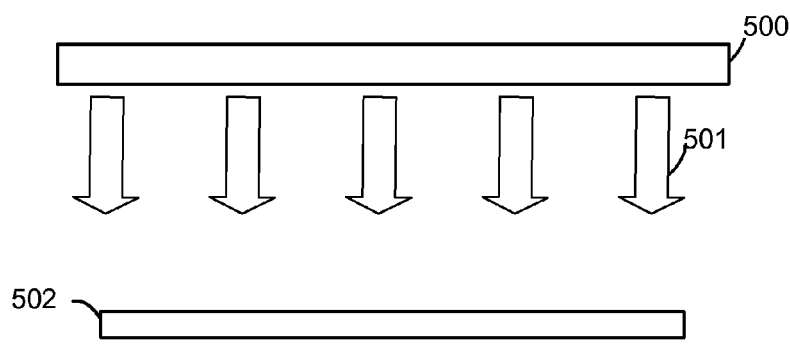
FIG. 5A depicts a UV treatment of the pixel of FIG. 1D, consistent with step 312 of FIG. 3.

In another option, step 312 involves performing a UV light treatment such as depicted in FIG. 5A. This can be performed after the gate oxide layer is deposited. For example, an ultraviolet light treatment can be characterized by a light intensity of 1 to 100 microWatts/cm2, a duration of 30 to 1200 seconds, and an energy of 3 to 10 eV. The UV treatment can occur before the deposition of the micro lens and the packaging of the image sensor chip since the micro lens and other glass areas on top of the chip can block UV light. In another option, step 313 involves performing a plasma treatment such as depicted in FIG. 6. This can be performed after the gate oxide layer is deposited. For example, an oxygen plasma treatment can be characterized by a power of 400 to 800 Watts and a duration of 120-360 seconds.

Combinations of the above treatments may be used as well.

A goal of the treatments is to avoid any unstable behavior for a time-of-flight image sensor by isolating the effects of the interface traps and fixed charges on the designed electric field area. A first step is to reduce the charge effect by improving the quality of the interface between the silicon and the oxide so that there are fewer traps, and shielding those traps to improve pixel performance. This can be done by modifying the dielectric material in the process to a different dielectric material which has different chemistry and charging properties, for example hydrogen-enriched oxide or nitride (step 304). A second step is to completely eliminate the effect of the undesired charges by compensating for them using other charge treatments (step 310). One option is a UV treatment of a specific wavelength and power for a certain amount of time on the surface of the wafer. This calibrated treatment with a specific wavelength, UV lamp power, and exposure time, allows the detector to operate robustly with reliable and instantaneous high performance. However, excessive UV exposure may harm the pixel performance.

Another option involves treating the wafer in a plasma radiation chamber, for example, using O2 plasma, for a specific time and power which results in eliminating the effect of the traps while maintaining a steady, reliable, high performance operation of the image sensor.

Another possible option uses an additional p-type shallow implant as an electrical field shield to protect the surface of the silicon detector. The doped region has a sufficiently high doping level to completely isolate the time-of-flight detector area (e.g., region 204c in FIG. 2A) from any effect of the trap charges and fixed charges.

These approaches result in a robust and reliable detector design in which the region of the epitaxial layer of the substrate which is just below the shield is immune to the effects of trap charges and fixed charges. The detector performance is minimally affected by this shield.

FIG. 4A depicts a cross-sectional view along line 110 of the pixel of FIG. 1D, consistent with steps 300-303 and 311 of FIG. 3. Electric field shields 401, 402, 403 and 404 are provided in the epitaxial layer of the substrate. Each shield can extend generally from the top surface of the epitaxial portion to a depth of d2. This can be less than a depth d1 of the low p-type doping regions directly below the gate electrodes, in one approach. Further, each shield can extend a width w2 between adjacent doping regions below the gate electrodes, e.g., from one of the doping regions to another. For example, the shield 401 extends from the doping region 102d to the doping region 103d. A width of the doping region of a gate electrode is w1. Note that the figures are not necessarily to scale. The shield can block any induced electric field from an area above the shield (e.g., from the interface, gate oxide or dielectric material) reaching an area below the shield (e.g., region 204c in FIG. 2A).

Figure 4B:
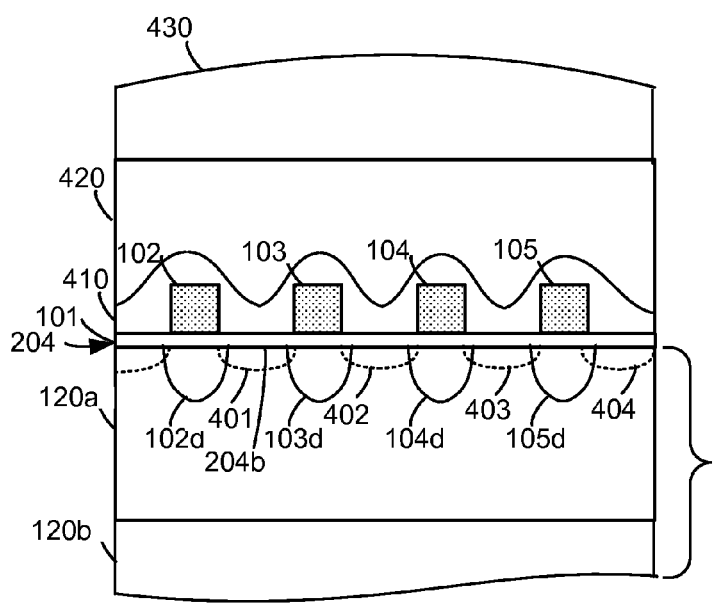
FIG. 4B depicts a cross-sectional view along line 110 of the pixel of FIG. 1D, consistent with steps 304-306 of FIG. 3.

FIG. 4B depicts a cross-sectional view along line 110 of the pixel of FIG. 1D, consistent with steps 304-306 of FIG. 3. A hydrogen-enriched dielectric material 410 (e.g., layer) is deposited over the gate electrodes and the gate oxide layer, and an additional dielectric material 420 (e.g., layer) is deposited over the hydrogen-enriched dielectric material. Further processing includes providing a micro lens 430.

FIG. 5A depicts a UV treatment of the pixel of FIG. 1D, consistent with step 312 of FIG. 3. A UV lamp 500 provides UV light 501 which is directed at the image sensor 502. The dielectric material above the gate oxide is not depicted but may be present.

FIG. 5B depicts a plot of the response of a pixel as a function of the UV treatment of FIG. 5A. The vertical axis depicts a signal magnitude in arbitrary units and the horizontal axis depicts a UV dose in arbitrary units. A UV dose can be specified in units of light intensity (mW/cm2)× exposure time (sec.)=energy per area (mJ/cm2). When the UV dose is below a specified level x1, the signal is below its optimum level, y1. When the UV dose is at x1 or higher, the signal is at its optimum level. The optimum dose can vary based on different factors and can be determined from testing. In an example implementation, the ultraviolet light treatment is characterized by a light intensity of 1 to 100 microWatts/cm2 and an exposure time of 30-1200 seconds.

A similar benefit is seen with the use of a plasma treatment, where the horizontal axis depicts a plasma dose which is characterized by a gas flow rate, a power level and a duration. An optimal dose can be determined from testing.

FIG. 6 depicts an apparatus for performing a plasma treatment consistent with step 313 of FIG. 3. A chamber 620 includes an inlet 621 for a reacting gas and an outlet 629 or exhaust connected to a vacuum pump 630 which provides a vacuum in the chamber. The wafer 603 comprising the image sensor is held in a top plate 627 on a heating block 628. The heating block can be used to set the temperature of the wafer and the chamber. An example temperature for plasma reduction is from room temperature (20 degrees C.) up to 600 degrees C. The wafer can be loaded and unloaded via an opening 632.

The reacting gas enters the chamber via a showerhead 624. The showerhead has many holes facing the wafer which uniformly inject the gas into the chamber toward the wafer. The showerhead is electrically connected to an RF circuit 622 via an electrode 623. The wafer is electrically connected to an RF circuit 631 via the top plate 627 and the heating block 628 which form another electrode.

The power from the RF circuit 622 is used to generate a plasma cloud 625 in the chamber. A plasma is a gas in which a significant percentage of the atoms or molecules are ionized. Such ionization generates high energy radiation such as UV and extreme UV (EUV). These high energy photons reach the pixel silicon surface area with abundant interface traps and modify their electrical polarity. The electrical property change enables and improve charge transport of the silicon CMOS device underneath.

Note that a plasma treatment typically includes exposure to UV light as well.

The techniques described herein are valid for any type of CMOS image sensor, including those with different structures of biasable gate electrodes and interface and low doped epitaxial layer. Such sensors may or may not be configured as time-of-flight image sensors. For a non-time-of-flight image sensor, the instability behavior will be the time varying electrical signal due to fixed illumination intensity.

The term "image sensor" includes a range image sensor and a time-of-flight image sensor. Typically, CMOS image sensors that are not time-of-flight sensors are not unstable. Any design of a regular image sensor typically includes a photodiode that has sufficient doping to block the effects of interface traps, and it is typically pinned too, so that instability is avoided.

Accordingly, it can be seen that a CMOS range image sensor is provided which includes: a silicon substrate with a top portion comprising a low doped epitaxial layer; an oxide layer on a top surface of the silicon substrate, wherein an interface is formed between the oxide layer and the top surface of the silicon substrate; at least one pair of biasable polysilicon gate electrodes spaced apart on the oxide layer; at least one layer of dielectric material over the biasable polysilicon gate electrodes and the oxide layer, the at least one layer of dielectric material is configured to reduce a likelihood of an induced electric field in the epitaxial layer; and an additional layer of dielectric material over the at least one layer of dielectric material.

The at least one layer of dielectric material is configured to reduce the likelihood of the induced electric field in the epitaxial layer caused by at least one of interface traps at the interface or fixed charges in the other layers of dielectric material, and to prevent an instability behavior of the image sensor. Moreover, the at least one layer of dielectric material can be a combination stack of two or more dielectric materials with at least one hydrogen-enriched dielectric material.

A p-type region may be provided in the epitaxial layer at the top surface of the silicon substrate between the biasable polysilicon gate electrodes, the where p-type region acts as an electric field shield.

A p-type region may be provided in the epitaxial layer below each of the biasable polysilicon gate electrodes either before or after the deposition of the biasable gate electrodes, where a depth of the p-type regions below each of the biasable polysilicon gate electrodes is greater than a depth of the p-type region which acts as the electric field shield.

A method of fabricating a stable CMOS image sensor comprises: providing a low doped epitaxial layer over a silicon substrate; depositing an oxide layer on a top surface of the epitaxial layer, wherein an interface is formed between the oxide layer and the top surface of the epitaxial layer; providing at least one pair of biasable polysilicon gate electrodes spaced apart on the oxide layer; depositing at least one layer of dielectric material over the biasable polysilicon gate electrodes and the oxide layer, wherein the at least one layer of dielectric material reduces a likelihood of an induced electric field in the epitaxial layer; and depositing an additional layer of dielectric material over the at least one layer of dielectric material.

The at least one layer of dielectric material can be a combination stack of two or more dielectric materials with at least one hydrogen-enriched dielectric material. The at least one layer of dielectric material comprises oxide or nitride in which hydrogen diffuses through deposition of the at least one layer of dielectric material into the interface and passivates interface traps. In addition, the dielectric material's inherent charge trapping properties can block fixed charge effects from other layers.

The method may further include performing a plasma treatment after the depositing of the at least one layer of the dielectric material to prevent an instability behavior.

The method may further include performing an ultraviolet light treatment after the depositing of the at least one layer of the dielectric material to prevent an instability behavior.

Another method for fabricating a CMOS time-of-flight image sensor comprises: providing an oxide layer on a top surface of an epitaxial layer of a substrate, wherein an interface is formed between the oxide layer and the top surface of the epitaxial layer; providing at least one pair of gate electrodes over the oxide layer; providing a dielectric material over the at least one pair of gate electrodes and the oxide layer; and performing a treatment to reduce a likelihood of an induced electric field in the epitaxial layer caused by at least one of interface traps at the interface and fixed charges in the dielectric material. The treatment results in the image sensor avoiding an unstable behavior in a first few seconds or minutes after the image sensor is powered on.

In an approach, means for fabricating a CMOS time-of-flight image sensor are provided including: means for providing an oxide layer on a top surface of an epitaxial layer of a substrate, wherein an interface is formed between the oxide layer and the top surface of the epitaxial layer; means for providing at least one pair of gate electrodes over the oxide layer; providing a dielectric material over the at least one pair of gate electrodes and the oxide layer; and means for performing a treatment to reduce a likelihood of an induced electric field in the epitaxial layer caused by at least one of interface traps at the interface and fixed charges in the dielectric material. The treatment results in the image sensor avoiding an unstable behavior in a first few seconds or minutes after the image sensor is powered on.

The foregoing detailed description of the technology herein has been presented for purposes of illustration and description. It is not intended to be exhaustive or to limit the technology to the precise form disclosed. Many modifications and variations are possible in light of the above teaching. The described embodiments were chosen to best explain the principles of the technology and its practical application to thereby enable others skilled in the art to best utilize the technology in various embodiments and with various modifications as are suited to the particular use contemplated. It is intended that the scope of the technology be defined by the claims appended hereto.

What is claimed is:

1. A CMOS range image sensor, comprising:
a silicon substrate with a top portion comprising an epitaxial layer;
an oxide layer on a top surface of the epitaxial layer, wherein an interface is formed between the oxide layer and the epitaxial layer;
at least one pair of gate electrodes spaced apart on the oxide layer;
at least one layer of dielectric material over the gate electrodes and the oxide layer;
under-gate p-type regions in the epitaxial layer below the gate electrodes, extending a width of each gate electrode and extending down from the top surface; and
between-gate p-type regions in the epitaxial layer at the top surface of the silicon substrate throughout an active area of the epitaxial layer, between but not under the gate electrodes, and adjacent to and above a low doped p-type portion of the epitaxial layer, a doping concentration of the between-gate p-type regions is higher than a doping concentration of the low doped p-type portion of the epitaxial layer, and each between-gate p-type region extends between adjacent ones of the under-gate p-type regions from one under-gate p-type region to another under-gate p-type region.

2. The CMOS range image sensor of claim 1, further comprising:
an additional layer of dielectric material over the at least one layer of dielectric material, wherein the at least one layer of dielectric material is configured to reduce a likelihood of an induced electric field in the epitaxial layer caused by fixed charges in the additional layer of dielectric material.

3. The CMOS range image sensor of claim 1, wherein:
the at least one layer of dielectric material is a combination stack of two or more dielectric materials with at least one hydrogen-enriched dielectric material; and
the hydrogen-enriched dielectric material comprises oxide or nitride in which hydrogen diffuses through deposition of the at least one layer of dielectric material into the interface and passivates interface traps.

4. The CMOS range image sensor of claim 1, wherein:
a depth of the under-gate p-type regions is greater than a depth of the between-gate p-type regions.

5. The CMOS range image sensor of claim 1, wherein:
the gate electrodes comprise photogates configured to collect charges generated in the active area of the epitaxial layer due to incoming light in a multi-gate phase demodulation pixel in a time-of-flight sensor.

6. The CMOS range image sensor of claim 1, wherein:
the at least one layer of dielectric material is configured to reduce a likelihood of an induced electric field in the epitaxial layer caused by interface traps at the interface.

7. The CMOS range image sensor of claim 1, wherein:
the gate electrodes comprise photogates configured to collect charges generated in the active area due to incoming light.

8. The CMOS range image sensor of claim 1, wherein:
the gate electrodes comprise doped polysilicon.

9. The CMOS range image sensor of claim 1, wherein:
portions of the under-gate p-type regions at the top surface are adjacent to the between-gate p-type regions; and
remaining portions of the under-gate p-type regions are adjacent to the low doped p-type portion of the epitaxial layer.

10. A method of fabricating a stable image sensor, comprising:

providing an epitaxial layer over a silicon substrate;
depositing an oxide layer on a top surface of the epitaxial layer, wherein an interface is formed between the oxide layer and the top surface of the epitaxial layer;
providing at least one pair of gate electrodes spaced apart on the oxide layer;
depositing at least one layer of dielectric material over the gate electrodes and the oxide layer;
providing p-type doping regions in the epitaxial layer extending downward from the gate electrodes and extending a width of each gate electrode; and
implanting p-type regions in the epitaxial layer at the top surface of the epitaxial layer, wherein a doping concentration of the p-type regions at the top surface is higher than a doping concentration of p-type portions of the epitaxial layer which are adjacent to and below the p-type regions, each p-type region at the top surface extends between adjacent ones of the p-type doping regions from one p-type doping region to another p-type doping region.

11. The method of claim 10, further comprising:
depositing an additional layer of dielectric material over the at least one layer of dielectric material, wherein the additional layer of dielectric material comprises oxide or nitride which has a charge trapping capability.

12. The method of claim 10, further comprising:
performing an oxygen plasma treatment after the depositing of the at least one layer of the dielectric material to prevent an instability behavior.

13. The method of claim 12, wherein:
the oxygen plasma treatment is characterized by a power of 400 to 800 Watts and a duration of 120-360 seconds.

14. The method of claim 10, further comprising:
performing an ultraviolet light treatment after the depositing of the at least one layer of the dielectric material to prevent an instability behavior.

15. The method of claim 14, wherein:
the ultraviolet light treatment is characterized by a light intensity of 1 to 100 microWatts/cm2, a duration of 30 to 1200 seconds, and an energy of 3 to 10 eV.

16. A method for fabricating a CMOS time-of-flight image sensor, comprising:
providing an oxide layer on a top surface of an epitaxial layer of a substrate, wherein an interface is formed between the oxide layer and the top surface of the epitaxial layer and the epitaxial layer has a low p-type doping concentration;
providing at least one pair of gate electrodes over the oxide layer;
providing a p-type doping region in the epitaxial layer below each gate electrode and extending downward from the top surface of the epitaxial layer;
providing a dielectric material over the at least one pair of gate electrodes and the oxide layer; and
implanting p-type regions throughout an active area of the epitaxial layer at the top surface of the epitaxial layer and between the gate electrodes to a depth which is less than a depth of the p-type doping regions below the gate electrodes, wherein a doping concentration of the p-type regions at the top surface is higher than the low p-type doping concentration, and each p-type region at the top surface extends between adjacent ones of the p-type doping regions below the gate electrodes, from one p-type doping region to another p-type doping region.

17. The method of claim 16, wherein:
the p-type regions at the top surface avoid an unstable behavior of a time varying electrical signal for fixed illumination intensity or fixed phase shift when the sensor is powered on.

18. The method of claim 16, wherein:
the dielectric material is hydrogen-enriched.

19. The method of claim 16, further comprising:
performing a UV treatment or a plasma treatment after the providing of the dielectric material.

20. The method of claim 16, wherein:
a portion of the epitaxial layer having the low p-type doping concentration is adjacent to and below the p-type regions at the top surface.

* * * * *